United States Patent [19]

Yamamuro

[11] Patent Number: 4,877,953
[45] Date of Patent: Oct. 31, 1989

[54] CURRENT-VOLTAGE CONVERTER CIRCUIT

[75] Inventor: Mikio Yamamuro, Kanagawa, Japan

[73] Assignee: Kabushiki Kaisha Toshiba, Kanagawa, Japan

[21] Appl. No.: 245,174

[22] Filed: Sep. 15, 1988

[30] Foreign Application Priority Data

Sep. 30, 1987 [JP] Japan ................................ 62-246008

[51] Int. Cl.$^4$ ............................................. H01J 40/14
[52] U.S. Cl. ................................. 250/214 R; 307/261
[58] Field of Search .................... 250/214 A; 307/261, 307/359, 494, 529, 311

[56] References Cited

U.S. PATENT DOCUMENTS

4,010,424  3/1977  Faulkner .............................. 307/359
4,710,622  12/1987  Imamura ......................... 250/214 R Primary Examiner—David C. Nelms
Assistant Examiner—Khaled Shami
Attorney, Agent, or Firm—Finnegan, Henderson, Farabow, Garrett & Dunner

[57] ABSTRACT

A current-voltage converter circuit includes a current source outputting a current having a low-pass signal component and a high-pass signal component, a band splitter, a first converter, and a second converter. The band splitter splits the current output from the current source into the low-pass signal component and the high-pass signal component. The first converter converts the low-pass signal component split off by the band splitter into a first output signal having a first prescribed voltages. The second converter converts the output signal from the first converter and the high-pass signal component split off by the band splitter into a second output signal having a second prescribed voltage.

14 Claims, 2 Drawing Sheets $$\left(=\frac{1}{(R_1+R_2)C}\right) \quad \left(=\frac{1}{R_2 C}\right)$$

CURRENT-VOLTAGE CONVERTER CIRCUIT

BACKGROUND OF THE INVENTION

1. Field of the Invention

The present invention relates to a current-voltage converter circuit which processes currents output from photodiodes used as light-receiving devices in, for instance, the optical heads of optical disc apparatus.

2. Description of the Related Art

In the case of the optical head used in an optical disc apparatus, the reflected light from an optical disc is detected by using a plurality of photodiodes. The output currents from these photodiodes are converted into voltages by a current-voltage converter circuit and, by the suitable combination of these voltages, a focussing signal for focussing an objective lens, a tracking signal for tracking the optical disc and an information signal are produced. Here, the bandwidths of the focussing signal and the tracking signal are 0-20 kHz, and the bandwidth of the information signal has a broad bandwidth of 0 - several MHz.

In the conventional current-voltage converter circuit, the outputs currents of first and second current sources, which are composed of photodiodes, are respectively supplied to first and second operational amplifier circuits, and converted into voltage values. The output voltages of the first and second operational amplifier respectively, produce low-pass signals $V_1$ and $V_2$ via first and second low-pass filters. The focussing signal and the tracking signal are produced from low-pass signals $V_1$ and $V_2$. Also, the output voltages of the first and second operational amplifiers are combined by a synthesizer circuit, and an information signal $V_3$ is produced.

However, in the above conventional circuit, the output currents of the first and second current sources which include 0 - several MHz signal are directly converted into voltage values by the first and second operational amplifier circuits. Therefore, it is necessary for the first and second operational amplifier circuits to possess broadband characteristics, and the operational amplifier of the synthesizer circuit which combines these output voltages must also have a broadband characteristic. Moreover, since the output currents of the current sources are directly converted into voltage, at least one operational amplifier circuit having broadband characteristics is required for each current source. Generally, the operational amplifiers having broadband characteristics are relatively expensive. Thus there was a problem in that, as the number of current sources increased, the circuit production cost became increasingly expensive.

SUMMARY OF THE INVENTION

It is an object of the present invention to provide a current-voltage converter circuit which can reduce the number of operational amplifier circuits required to have broadband characteristics and can thus reduce the production cost of the circuit.

According to one aspect of the present invention, there is provided a current-voltage converter circuit comprising means for outputting a current having a low-pass signal component and a high-pass signal component, band split means for splitting the current output from the current outputting means into the low-pass signal component and the high-pass signal component, first conversion means for converting the low-pass signal component split off by the band split means into a first output signal having a first prescribed voltage, and second conversion means for converting the output signal from the first conversion means and the highpass signal component split off by the band split means into a second output signal having a second prescribed voltage.

BRIEF DESCRIPTION OF THE DRAWINGS

These and other objects and advantages of the present invention will become more apparent and more readily appreciated from the following detailed description of the presently preferred exemplary embodiments, taken in conjunction with the accompanying drawings of which.

DETAILED DESCRIPTION OF THE PREFERRED EMBODIMENTS

The following is an explanation of an embodiment of the present invention with reference to the drawings.

Figure 1:
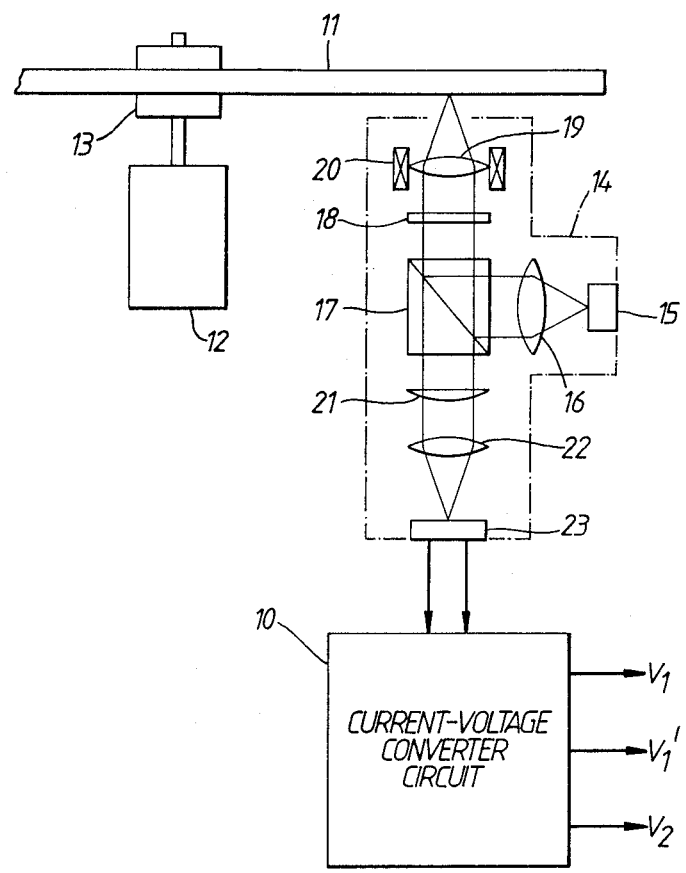
FIG. 1 is a schematic view showing an optical disc apparatus in which a current-voltage converter circuit according to the present invention is applied.

FIG. 1 shows an optical disc apparatus in which a current-voltage converter circuit 10 according to the present invention is applied. An optical disc 11 is attached to a turntable 13, which is connected to a motor 12. Optical disc 11 has a spiral track or concentric circular tracks. An optical head 14 is disposed in face-to-face relation with optical disc 11. Optical head 14 may be moved in either radial direction of the disc 11. Optical head 14 has a laser 15. On the output side of laser 15, a collimator lens 16 is disposed. On the output side of lens 16, a beam splitter 17 is provided. Between beam splitter 17 and optical disc 11, a quarter-wave plate 18 is interposed, Between quarter-wave plate 18 and disc 11, an objective lens 19 is disposed. Objective lens 19 is positioned coaxial with a voice coil 20. When voice coil 20 is excited, lens 19 moves along its optical axis. On the other side of beam splitter 17, away from optical disc 11, a cylindrical lens 21, a condenser lens 22 and an optical sensor 23 are disposed coaxial with one another. The output terminals of optical sensor 23 are connected to currentvoltage circuit 10.

Figure 2:
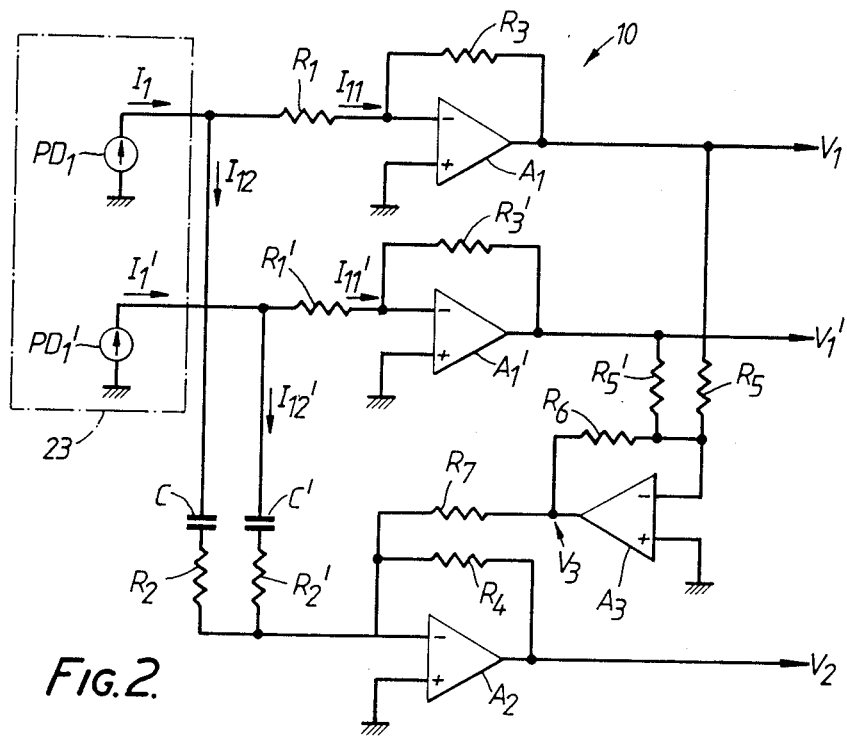
FIG. 2 is a circuit diagram showing an embodiment of the present invention.

Current-voltage converter circuit 10 is shown in FIGURE 2 in detail. Optical sensor 23 functions as current sources $PD_1$ and $PD_1'$. One end of each of current sources $PD_1$ and $PD_1'$, which are for instance composed of photodiodes, is grounded, and the other ends are connected to the inverting input terminals of operational amplifiers $A_1$ and $A_1'$, respectively, via resistors $R_1$ and $R_1'$. The noninverting input terminals of operational amplifiers $A_1$ and $A_1'$ are grounded, and their output terminals are connected to their inverting input terminals via resistors $R_3$ and $R_3'$.

The other ends of current sources $PD_1$ and $PD_1'$ are connected to the inverting input terminal of an operational amplifier $A_2$ via respective series circuits comprising condensers C and C' and resistors $R_2$ and $R_2'$. The noninverting input terminal of operational amplifier $A_2$ is grounded, and its output terminal is connected to its inverting input terminal via resistor $R_4$.

One end of each of resistors $R_5$ and $R_5'$ is respectively connected to the output terminals of operational amplifiers $A_1$ and $A_1'$, and the other ends of resistors $R_5$ and $R_5'$ are connected to the inverting input terminal of an operational amplifier $A_3$. The noninverting input terminal of operational amplifier $A_3$ is grounded, while the output terminal of operational amplifier $A_3$ is connected to its inverting input terminal via resistor $R_6$ and to the inverting input terminal of operational amplifier $A_2$ via resistor $R_7$.

In the above circuit, the output currents $I_1$ and $I_1'$ of current sources $PD_1$ and $PD_1'$ are designed to be split into their respective low-pass signal components $I_{11}$ and $I_{11}'$ and high-pass signal components $I_{12}$ and $I_{12}'$ by the band-splitting filters composed of resistors $R_1$, $R_1'$, $R_2$ and $R_2'$ and condensers C and C'. Here, $I_{11}$ and $I_{12}$ have the following relationship.

$$I_{11} = (1+j\omega CR_2)/\{1+j\omega C(R_1+R_2)\}I_1$$

$$I_{12} = j\omega CR_1/\{1+j\omega C(R_1+R_2)\}I_1$$

The relationships between $I_1'$, $I_{11}'$ and $I_{12}'$ are the same as above.

Therefore, output voltage $V_1$ (the low-pass signal component) of operational amplifier $A_1$ becomes $$V_1 = -(1+j\omega CR_2)/\{1+j\omega C(R_1+R_2)\}I_1 R_3$$

and output voltage $V_1'$ (the low-pass signal component) of operational amplifier $A_1'$ also has the same relationship. The tracking signal and focussing signal are produced from output voltages $V_1$ and $V_1'$.

Also, output voltages $V_1$ and $V_1'$ of operational amplifiers $A_1$ and $A_1'$ are combined by operational amplifier $A_3$, and this combined signal and the high-pass signal components split off by the band-splitting filters are current-voltage converted by operational amplifier $A_2$. Here, when $R_3 = R_3' = R_5 = R_5'$, the output voltage $V_3$ of operational amplifier $A_3$ is $$\begin{aligned}
V_3 &= -R_6(V_1 + V_2)/R_5 \\
&= (1 + j\omega CR_2)/\{1 + j\omega C(R_1 + R_2)\} \cdot (I_1 + I_1') \cdot R_6
\end{aligned}$$

Therefore, when $R_7 = R_6$, output voltage $V_2$ of operational amplifier $A_2$ is $$\begin{aligned}
V_2 &= -R_4\{(I_{12} + I_{12}') + V_3/R_1\} \\
&= -R_4[j\omega CR_1/\{1 + j\omega C(R_1 + R_2)\} \cdot (I_1 + I_1') + \\
&\quad (1 + j\omega CR_2)/\{1 + j\omega C(R_1 + R_2)\} \cdot (I_1 + I_1')] \\
&= -R_4(I_1 + I_1')
\end{aligned}$$

Consequently, the total of the input currents is exhibited in output voltage $V_2$ of operational amplifier $A_2$ as a current-voltage converted output over the whole bandwidth, and this is used as the information signal.

The voltage $V_2$ of operational amplifier $A_2$ can be obtained by following another calculations.

$$\begin{aligned}
V_1 &= -R_3 I_{11}, V_1' = -R_3' I_{11}' \\
V_3 &= -R_6(V_1/R_5 + V_1'/R_5') \\
&= -R_6\{(-R_3 I_{11}/R_5) + (-R_3' I_{11}'/R_5')\} \\
&= R_6(R_3 I_{11}/R_5 + R_3' I_{11}'/R_5') \\
V_2 &= -R_4(I_{12} + I_{12}' + V_3/R_7) \\
&= -R_4\{I_{12} + I_{12}' + (R_6/R_7) \cdot (R_3 I_{11}/R_5 + R_3' I_{11}'/R_5')\}
\end{aligned}$$

Here, when $(R_6/R_7) \cdot (R_3/R_5) = 1$, $(R_6/R_7) \cdot (R_3'/R_5') = 1$, the output voltage $V_2$ is $$\begin{aligned}
V_2 &= -R_4(I_{12} + I_{12}' + I_{11} + I_{11}') \\
&= -R_4(I_1 + I_1')
\end{aligned}$$

Therefore, when $(R_6/R_7) \cdot (R_3/R_5) = 1$, $(R_6/R_7) \cdot (R_3'/R_5') = 1$, the output voltage $V_2$ of operational amplifier $A_2$ is obtained as an output voltage having a conversion gain distributed uniformly over the whole bandwidth of operational amplifier $A_2$. The converion gain of operational amplifier $A_2$ is suitably selected by the value of $R_3$.

Resistors $R_1$ and $R_2$ and condenser C are selected so as to a frequency f defined by following relation is lower than a maximum frequency defining the bandwidth of the first operational amplifier:

$$f = 1/2\pi(R_1 + R_2)C$$

By the above mentioned selection of resistors $R_1$ and $R_2$ and condenser C, a voltage not having considerable ununiformity is output from operational amplifiers $A_1$.

The relationships between resistors $R_1'$, $R_2'$ and condenser C' and the output voltage of operational amplifier $A_1'$ are the same as above.

Figure 3:
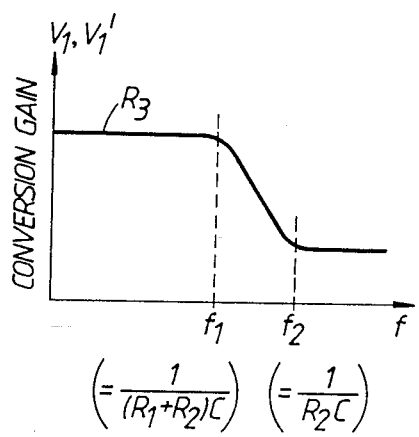
FIGS. 3 and 4 are illustrations of the operational characteristics of the operational amplifiers shown in FIG. 2.
Figure 4:
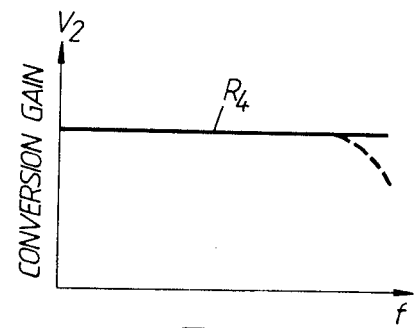

FIG. 3 shows the frequency curve of output voltages $V_1$ and $V_1'$ of operational amplifiers $A_1$ and $A_1'$, and FIGURE 4 shows output voltage $V_2$ of operational amlifier $A_2$.

In this way, a broadband conversion characteristic is only required for operational amplifier $A_2$, and operational amplifiers $A_1$, $A_1'$ and $A_3$ need only perform current-voltage conversion and amplification in low-pass frequency bands such as shown in FIG. 3. For his reason, if resistors $R_1$, $R_1'$, $R_2$ and $R_2'$ and condensers C and C' are suitably selected, it is possible to use relatively low-cost operational amplifiers for operational amplifiers $A_1$, $A_1'$ and $A_3$.

In the above embodiment, the output currents of current sources $PD_1$ and $PD_1'$ are split into low-pass signal components and high-pass signal components by band-splitting filters composed of resistors $R_1$, $R_1'$, $R_2$ and $R_2'$ and condensers C and C'. The low-pass signal components are current-voltage converted by operational amplifiers $A_1$ and $A_1'$. Then, the output voltages of operational amplifiers $A_1$ and $A_1'$ which have been combined by operational amplifier $A_3$, and the band-split high-pass signal components are current-voltage converted by operational amplifier $A_2$ which has a broadband characteristic. Therefore, since it is no longer necessary to have the same number of operational amplifiers which have broadband characteristics as the number of current sources, as was the case in prior art, it is possible to reduce the number of operational amplifiers with broadband characteristics, and thus the production cost of circuits can be reduced.

In the above embodiment, the case of two current sources has been described, but the present invention is not limited to this and can be applied to cases in which the numbers of current sources are increased. Also, the greater the number of current sources, the greater the effect of the present invention.

As described above, in the present invention, a current-voltage converter circuit can be provided which can reduce the number of high-cost operational amplifier circuits with broadband characteristics and, moreover, can correctly perform current-voltage conversion. This is achieved by splitting the output currents output from a plurality of current sources into low-pass signal components and high-pass signal components using a band-splitting means and performing the current-voltage conversion of these low-pass signal components using a first current-voltage conversion means, and then performing current-voltage conversion on the output signals of the first current-voltage conversion means and the split-off high pass signal components using a second current-voltage conversion means.

Various other modifications could be made in the present invention without departing from the scope or spirit of the following claims.

What is claimed is:

1. A current-voltage converter circuit comprising:
   means for outputting a current having a low-pass signal component and a high-pass signal component;
   band split means for splitting the current output from the current outputting means into the low-pass signal component and the high-pass signal component;
   first conversion means for converting the low-pass signal component split off by the band split means into a first output signal having a first prescribed voltage; and
   second conversion means for converting the output signal from the first conversion means and the high-pass signal component split off by the band split means into a second output signal having a second prescribed voltage.

2. The circuit of claim 1 wherein the current outputting means includes an optical sensor.

3. The circuit of claim 2 wherein the optical sensor includes a photodiode.

4. The circuit of claim 1 wherein the band split means includes:
   a first resistor connected to the current outputting means in series; and
   a series circuit comprising a condenser and a second resistor connected to the current outputting means in parallel.

5. The circuit of claim 4 wherein the first conversion means includes a first operational amplifier having an inverting input terminal connected to the first resistor, a grounded noninverting input terminal, and output terminal means including a third resistor connected to the inverting input terminal for outputting the first prescribed voltage.

6. The circuit of claim 5 wherein the second conversion means includes a second operational amplifier having an inverting input terminal connected to the series circuit, a grounded noninverting input terminal, and output terminal means including a fourth resistor connected to the inverting input terminal for outputting the second prescribed voltage.

7. A current-voltage converter circuit comprising:
   a plurality of current sources, each for outputting a current having a low-pass signal component and a high-pass signal component;
   band split means for splitting the current output from each of the plurality of current sources into the corresponding low-pass signal components and high-pass signal components;
   first conversion means for converting each of the low-pass signal components split off by the band split means into a corresponding output signal having an associated voltage; and
   second conversion means for converting the output signals from the first conversion means and the high-pass signal components split off by the band split means into a second output signal having a prescribed voltage different from any of the associated voltages.

8. The circuit of claim 7 wherein the band split means includes:
   first resistors connected in series with each of the current sources, respectively; and
   series circuits each comprising a condenser and a second resistor connected in parallel with each of the current sources, respectively.

9. The circuit of claim 8 wherein the first conversion means includes first operational amplifiers corresponding to each of the current sources, each of the first operational amplifiers having an inverting input terminal connected to the first resistor of the corresponding current sources, a grounded noninverting input terminal, and output terminal means including a third resistor connected to the inverting input terminal of that first operational amplifer for outputting one of the associated voltages.

10. The circuit of claim 9 wherein the second conversion means includes a second operational amplifier having an inverting input terminal connected to the series circuits, a grounded noninverting input terminal, and output terminal means including a fourth resistor connected to the inverting input terminal for outputting the prescribed voltage.

11. The circuit of claim 10 also including third operational amplifier means connected to the output terminal of each of the first operational amplifiers and the inverting input terminal of the second operational amplifier for combining the voltages output from each of the first operational amplifiers.

12. The circuit of claim 11 wherein the third operational amplifier means includes:
   a third operational amplifier having an inverting input terminal, a grounded noninverting input terminal and an output terminal;
   fifth resistors connected between the output terminal means of each of the first operational amplifiers, respectively, and the inverting input terminal of the third operational amplifier;
   a sixth resistor connected between the inverting input terminal of the third operational amplifier and the output terminal of the third operational amplifier; and
   a seventh resistor connected between the output terminal of the third operational amplifier and the inverting intput terminal of the second operational amplifier.

13. The circuit of claim 12 wherein the third, fifth, sixth and seventh resistors $R_3$, $R_5$, $R_6$ and $R_7$ are defined as a following relation:

$(R_6/R_7)\cdot(R_3/R_5)=1$

14. The circuit of claim 5 wherein the first and second resistors $R_1$ and $R_2$ and the condenser C are selected so as to a frequency f defined by following relation is lower than a maximum frequency defining the bandwidth of the first operational amplifier:

$f=\frac{1}{2}\pi(R_1+R_2)C.$

* * * * *